United States Patent [19]

Inohara et al.

[11] Patent Number: 5,137,205

[45] Date of Patent: Aug. 11, 1992

[54] SYMMETRICAL CIRCUIT ARRANGEMENT FOR A X-Y MATRIX ELECTRODE

[75] Inventors: Akio Inohara, Osaka; Yuji Ohno, Yamatokoriyama; Kiyoshi Sawae; Yoshiharu Kanatani, both of Nara; Hisashi Uede, Yamatokoriyama; Takeo Fujimoto, Osaka, all of Japan

[73] Assignee: Sharp Kabushiki Kaisha, Osaka, Japan

[21] Appl. No.: 658,436

[22] Filed: Feb. 20, 1991

Related U.S. Application Data

[63] Continuation of Ser. No. 331,047, Mar. 28, 1989, abandoned, which is a continuation of Ser. No. 498,638, May 27, 1983, abandoned.

[30] Foreign Application Priority Data

May 31, 1982 [JP] Japan ............................ 57-81183[U]
Apr. 13, 1983 [JP] Japan ....................... 58-662

[51] Int. Cl.$^5$ ...................... H05K 3/34; H01L 21/603
[52] U.S. Cl. ................................. 228/180.2; 228/190; 228/254; 228/44.7
[58] Field of Search ............... 228/180.1, 180.2, 6.2, 228/189, 106, 44.7, 179, 51, 190, 254

[56] References Cited

U.S. PATENT DOCUMENTS

| | | | |
|---|---|---|---|
| 3,296,692 | 9/1963 | Griffin | 228/179 |
| 3,387,365 | 6/1968 | Stelmak | 228/180.2 |
| 3,555,364 | 1/1971 | Matcovich | 357/80 |
| 3,589,591 | 6/1971 | Schwenn | 228/44.7 |
| 3,705,332 | 12/1972 | Parks | 357/75 |
| 3,883,945 | 5/1975 | Wallis | 228/180.2 |
| 3,914,850 | 10/1975 | Coucoulas | 228/180.2 |
| 4,050,618 | 9/1977 | Angelucci et al. | 228/180.2 |
| 4,074,342 | 2/1978 | Honn et al. | 357/75 |
| 4,345,371 | 8/1982 | Ohsawa et al. | 228/180.2 |
| 4,371,912 | 2/1983 | Guzik | 228/180.2 |

FOREIGN PATENT DOCUMENTS 0153951 2/1982 German Democratic Rep. ................................. 228/180.2

OTHER PUBLICATIONS

"High Density and Speed Performance Chip Joining Procedure and Package"–Iafrate–IBM Tech Disclosure Bulletin–vol. 15, No. 4, Sep. 1972, p. 1282.

*Primary Examiner*—Samuel M. Heinrich

[57] ABSTRACT

A wiring circuit substrate comprises first circuit element means one one side of the substrate connected to electrode lines of X-Y matrix electrodes, respectively, and second circuit element means in the symmetrical position of the first circuit element means on the other side of the substrate connected to the electrode lines of the X-Y matrix electrodes, respectively, wherein each of leads of the first and the second circuit element means is connected to the output and input lines of the X-Y matrix electrodes via through holes, respectively.

The first circuit element comprises integrated transisitors for driving the X-Y matrix electrodes. The second circuit element comprises integrated diodes for protecting an overcurrent in the X-Y matrix electrodes.

7 Claims, 4 Drawing Sheets

SYMMETRICAL CIRCUIT ARRANGEMENT FOR A X-Y MATRIX ELECTRODE

This application is a continuation of application Ser. No. 07/331,047 filed on Mar. 28, 1989, now abandoned, which is a continuation of application Ser. No. 06/498,638 filed on May 27, 1983, now abandoned.

BACKGROUND AND SUMMARY OF THE INVENTION

This invention relates to a wiring circuit substrate that carries a great number of pairs of circuit elements packaged by resin molding or the like on the both sides of the wiring substrate, which provides a matrix electrode driving circuit of high degrees by giving symmetry and regularity on an arrangement of the circuit elements, and to a manufacturing process of the above wiring circuit substrate.

When a display device including display elements formed by X-Y matrix electrodes such as a thin film EL display device is driven, driving circuits are necessary comprising of a number of the electrodes. For example, in a display device having X electrodes of 240 lines and Y electrodes of 320 lines, the driving circuits at an amount of 560 circuits are necessary. Accordingly, in order to dispose so electrodes and many driving circuits, various devices of the driving circuit and packaging methods of circuit elements have been offered.

FIG. 1 is a block diagram of an peripheral circuit of a conventional thin film EL display device.

In the case where a display device 1 having X-Y matrix electrodes 16, is driven, the display device 1 must comprise electrode driving circuits 2 and 3 corresponding to each of the matrix electrodes, and logic circuits (serial-parallel conversion transmitters 6 and 7, memory circuits 5 and gate circuits 4, etc.).

Further, more wiring for connecting one of the logic circuits to another of the logic circuits, and one of the logic circuits to one of the electrodes of the matrix electrodes, is required.

The number of wirings for transmitting signals from data circuits 8 and 9 and a controller 10 to the serial-parallel conversion transmitor 6 is required to be several, and the wirings between the logic circuits are formed in an integrated circuit because the logics are formed on the substrate such as a ceramic substrate or the like.

In the electrode driving circuit, a drain of every high voltage driving transistors 11 is connected to a cathode of every diode as shown in FIG. 2, and a high voltage is outputted from the intersection between the drain of the high voltage driving transistor and the cathode of the diode.

When the electrode driving circuit is provided with a high voltage driving IC (integrated circuit) 13 including the high voltage transistors 11, and a high voltage driving diode array 14, intersections are formed between the drain of the transistors 11 and the cathode of diodes 12. Accordingly, a hybrid driving circuit, which is prepared with several sets of a high voltage driving IC and a high voltage driving diode array on a small substrate, which locates the wirings in the substrate, has been offered.

According to the above hybrid driving circuit, complex circuits are disposed on the same substrate, and this substrate is provided on a mother board such as a flexible substrate or the like. The number of output wirings correspond to that of input wirings of the matrix electrodes.

The above proposal has not improved the wirings of the high voltage driving transistors and the high voltage driving diodes.

Because both an IC including the high voltage transistors and the high voltage driving diodes are wired by thick films or the like, a great number of wirings are required for connecting the IC to the diodes. Further, the devices have low productivity and are expensive because of the high density formed by the small wirings. An additional space for the diode itself and the space of the wirings between the cathode of the diode and the transistor is required.

It is an object of the present invention to provide a wiring circuit substrate carrying a great number of pairs of circuit elements packaged by resin mold or the like on the both sides of the wiring substrate, which provides a matrix electrode driving circuit of high degrees by giving symmetry and regularity on an arrangement of the circuit elements.

It is another object to provide a manufacturing process of the above wiring circuit substrate.

It is a further object of the present invention to provide a new circuit substrate which is able to be smaller, lighter and lower in cost to form a display device having a matrix electrode.

According to the present invention, a circuit element including the pairing of a diode and a transistor can be arranged for each electrode line of the X-Y matrix electrodes, and the present invention can achieve not only a high density package with small wirings, but also high productivity.

Other objects and further scope of applicability of the present invention will become apparent from the detailed description given hereinafter. It should be understood, however, that the detailed description of, and specific examples, while indicating preferred embodiments of the invention are given by way of illustration only, since various changes and modifications within the spirit and scope of the invention will become apparent to those skilled in the art from this detailed description.

According to an embodiment of the present invention, a wiring circuit substrate comprises first circuit element means on one side of the substrate connected to electrode lines of X-Y matrix electrodes respectively, and second circuit element means in the symmetrical position of the first circuit element means on the other side of the substrate connected to the electrode lines of the X-Y matrix electrodes, respectively, wherein each of the leads of the first and the second circuit element means is connected output and input lines of the X-Y matrix electrodes via through holes, respectively.

The first circuit element means comprises integrated transistors for driving the X-Y matrix electrodes. The second circuit element means comprises integrated diodes for protecting an overcurrent in the X-Y matrix electrodes.

According to an embodiment of the present invention, a manufacturing method of an integrated circuit substrate comprises the steps of arranging temporarily in a symmetrical position on both sides of the substrate first circuit element means and second circuit element means which are to be connected to electrode lines of X-Y matrix electrodes, respectively, pressing and heating for connecting the leads of the first circuit element means and second circuit element means, connecting a pair of the connecting leads of the first circuit element means and the second circuit element means on the both sides of the substrate, translating the substrate to carry the new first and second circuit means after the previous first and the second circuit element element means are adhered to the substrate.

BRIEF DESCRIPTION OF THE DRAWINGS

The present invention will be better understood from the detailed description given hereinbelow and the accompanying drawings which are given by way of illustration only, and thus are not limitative of the present invention and wherein.

DETAILED DESCRIPTION OF THE PREFERRED EMBODIMENTS

Figure 1:
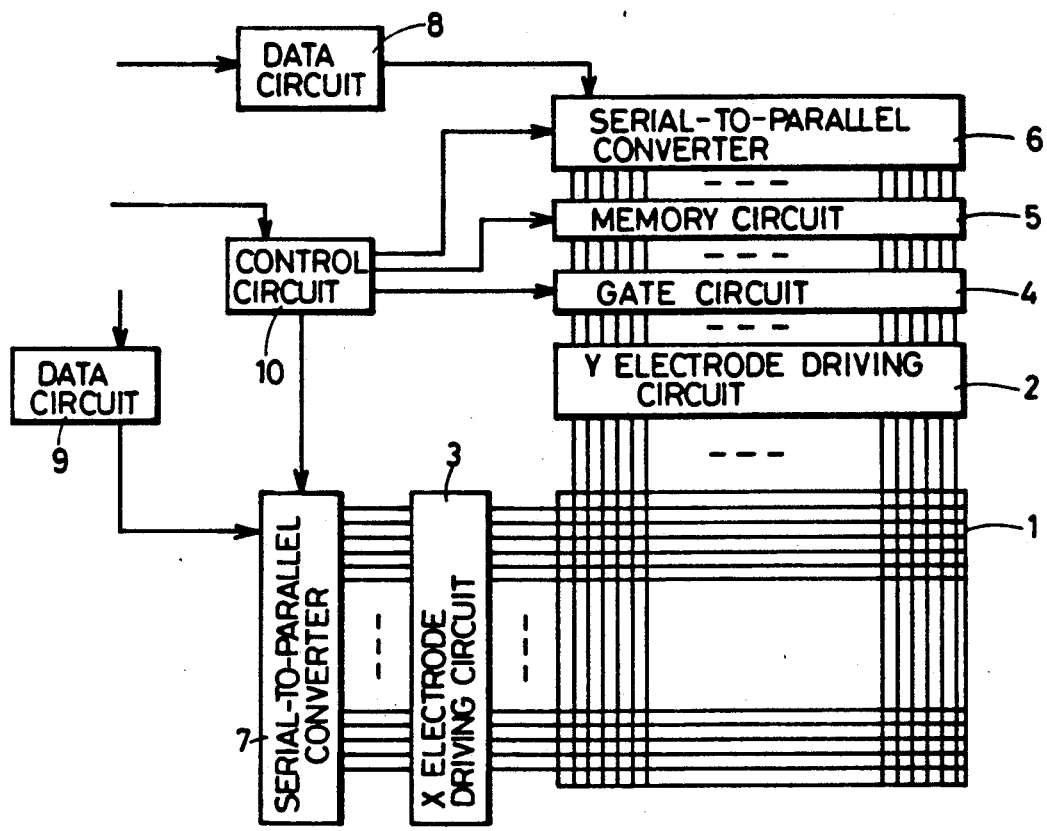
FIG. 1 shows a block diagram of a peripheral circuit of a conventional thin film EL display device.
Figure 2:
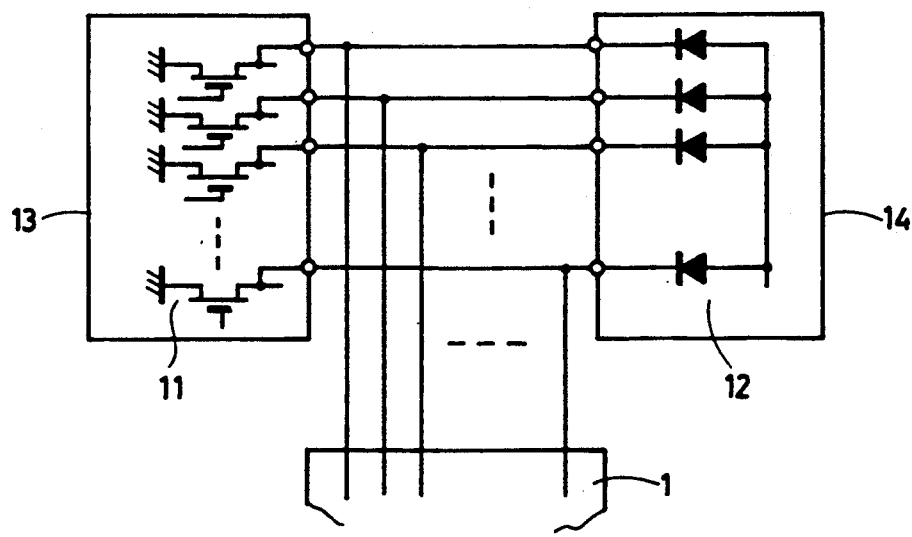
FIG. 2 shows an electrode driving circuit of an embodiment of the present invention.

FIG. 2 shows X-Y matrix electrode driving lines 15, for an integrated circuit according to an embodiment of the present invention.

A group of electrodes of X-Y matrix electrodes disposed for a thin film EL display devices 1, are connected to high voltage driving transistors 11 and high voltage diodes 12, respectively. The number of the high voltage transistors 11 and the number of high voltage driving diodes 12 equal the number of electrode lines, and a transistor array 13 integrated with the transistors 11 and a diode array 14 integrated with the diodes 12 are formed. The transistors 11 are connected to the diodes 12, respectively, and the intersection of each connection is connected to a respective one of the electrode lines via a conductive through-hole.

Each of the transistors 11 provides selectively a driving voltage on the electrode lines. Each of the diodes 12 protects electrode lines of a display device for driving with a high voltage such as a thin film EL elements. Each of the diodes 12 is necessary to prevent an overcurrent.

Both of the transistors 11 and the diodes 12 are provided for each of the electrode lines, respectively and connected thereto through a particular associated through-hole.

Figure 3:
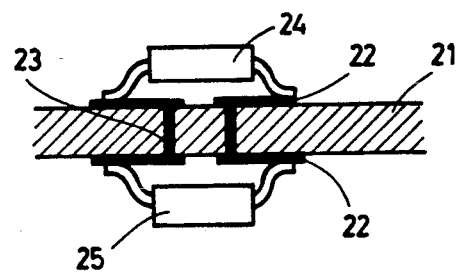
FIG. 3 shows a sectional view of a circuit substrate according the present invention.

FIG. 3 shows a circuit substrate according to an embodiment of the present invention.

Conductive wirings 22 are provided on both sides of a flexible substrate 21 made of an organic film or the like.

The conductive wirings 22 of both side of substrate 21 are electrically conductive via through holes 23. Longitudinal surfaces of the conductive wirings 22 are used to connect the electrode lines of the X-Y matrix electrodes to a designated one of the conductive through-holes.

A transistor package 24 comprising the transistor array 13 such as the driving IC integrated with the transistors 11 as shown FIG. 2 is provided over the conductive wirings 22 at one side of the substrate 21. A diode package 25 comprising the diode array 14 integrated with diodes 12 is provided over the conductive wirings 22 at the other side of the substrate 21.

The transistor package 24 and the diode package 25 are molded by resin in order to form a similar shape, and disposed in a symmetrical position on the conductive wirings 22 on both sides of the substrate 21 by left and right lead terminals.

Figure 4:
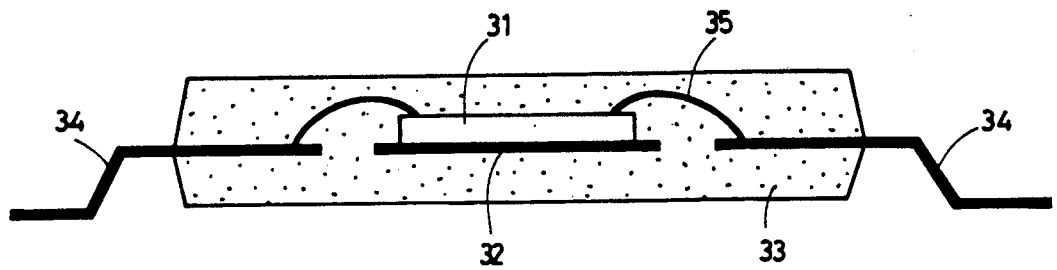
FIG. 4 shows an inner configuration of the package according to an embodiment of the present invention.

FIG. 4 shows an inner configuration of the packages 24 and 25.

The transistor array such as a high voltage MOS IC etc. and circuit elements 31 such as a high voltage diode array etc. are provided on a frame 32.

A resin mold 33 is coated around the frame 32.

Connecting leads 34 of the circuit device 31 are extended in the left and the right directions. The end of the leads 34 in the resin mold 33 are connected to the circuit device 31 by wirings 35. On the above description, a transistor mold structure is presented.

The packages 24 and 25 are connected to the substrate 21, for example, by a solder reflow method.

Both packages 24 and 25 are arranged in a symmetrical position over the conductive wirings 22 at both sides of substrate 21, and are supported temporarily by the leads 34. The substrate 21 of the above construction is set into a hot press apparatus as shown in FIG. 5, and is transferred, and leads 34 are adhered to the conductive wirings 22 of the substrate 21.

Figure 5:
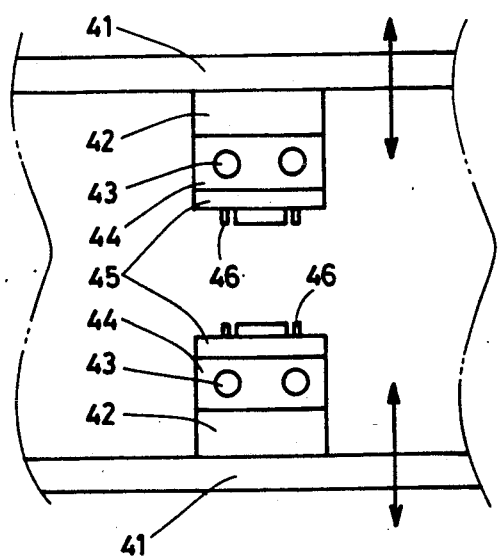
FIG. 5 shows a manufacturing apparatus according to an embodiment of the present invention.

The hot press apparatus of FIG. 5 comprises a pair of upper and lower movable supporters 41 and heater sections 44 containing heaters 43 via heat-insulators 42 on inside of opposing supporters 41, and heater collets 45 layered on the heater sections 44.

When the space of the supporter plates 41 becomes narrower, the leads 34 of the substrate 21 inserted between the heat collets 45 are pressed simultaneously by both sides of projections 46 of the heat collets 45. When the heaters 43 begin to heat in the above condition, the heat of the heaters 43 is transferred to the leads 34 via the heat collets 45, and a melted solder plating layer is formed on the conductive wirings 22 in advance. Next, when the temperature of leads 34 is lowered, the solder plating layer becomes hard, and the leads 34 are adhered to the conductive wirings 22. The shape of the heater collets 45 is preferably set to accord with the shape of the leads 34. When the leads 34 are adhered and the substrate 21 is transferred, leads 34 adjacent the new packages 24 and 25 are adhered to the conductive wirings 22 by repeating the similar the operations.

The packages 24 and 25 formed by different circuit elements are provided and arranged in a symmetrical position on both sides of the substrate 21. The through holes 23 are provided inside of the left and right lead terminals in view of an allowance of a space factor. Each of the leads of the transistor package 24 and the diode package 25 is connected to each of the electrodes via the conductive wirings, respectively.

The number of electrodes connected can be decided by the number of circuit elements which are integrated in each package 24 and 25. The number of the packages 24 and 25 which are provided on the substrate 21, can be decided by the total number of electrode lines.

The transistor package 24 and the diode package 25 on the substrate 21 are disposed symmetrically on both sides of substrate 21, and both of packages 24 and 25 are arranged with the same pitch. A solder for adhering the leads 34 may be not only a soldering material but also a printing or the like.

Figure 6:
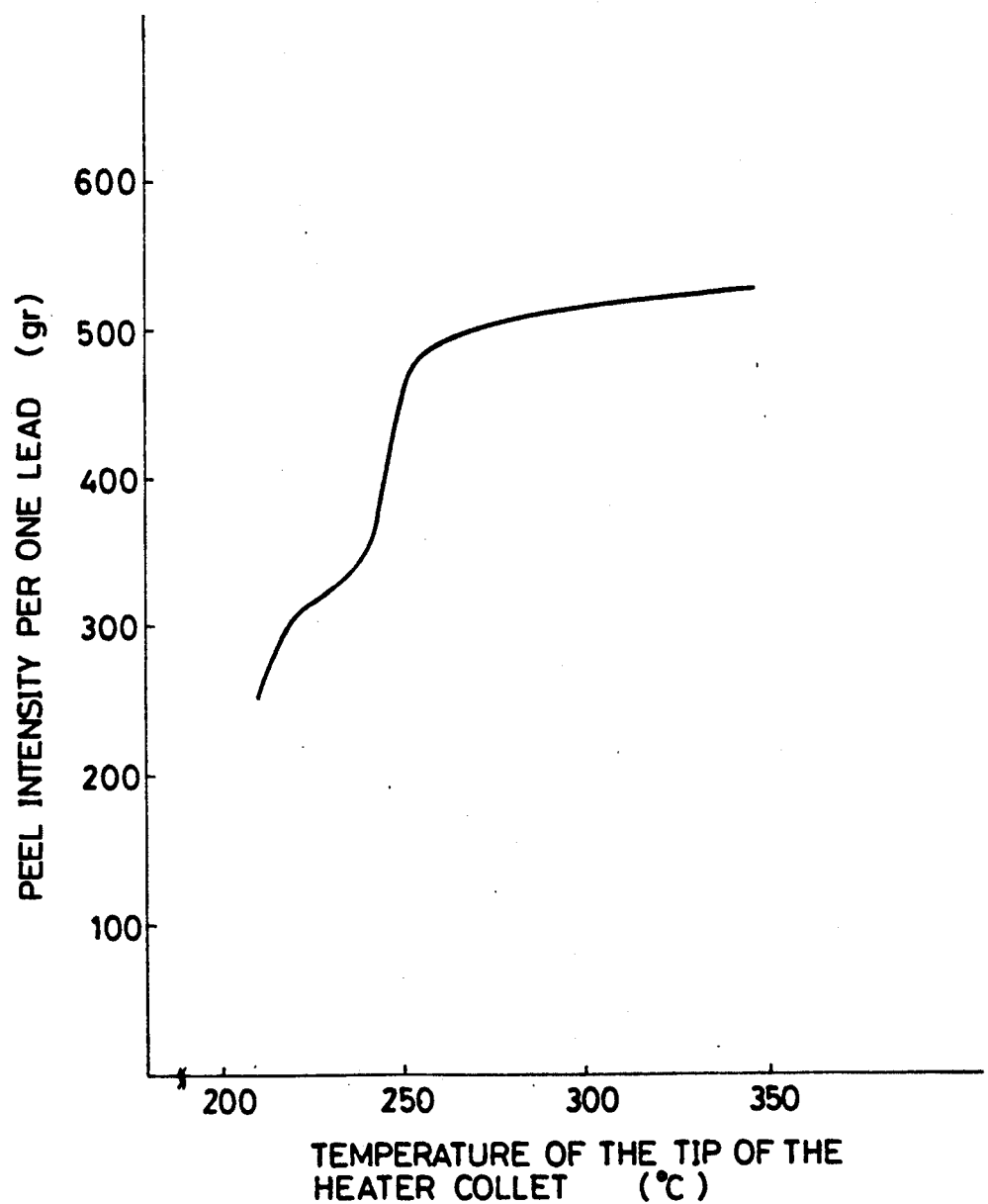
FIG. 6 shows a relationship between a temperature of the tip of the heater collet and the strength of a soldering peel.

FIG. 6 shows a relationship between a temperature of tip of the heater collet and the strength of a soldering peel.

A flexible substrate carrying a solder plating layer of about 40 μm in thickness is used for measurement. The packages 24 and 25 adhered to the conductive wiring on the flexible substrate in a heating time of about 2 sec.

As FIG. 6 shows, when a temperature of tip of the heater collets 45 is more than about 260° C., an average strength of the peel is about 500 gr per one lead. Accordingly, the soldering is easy and sufficient.

Figure 7:
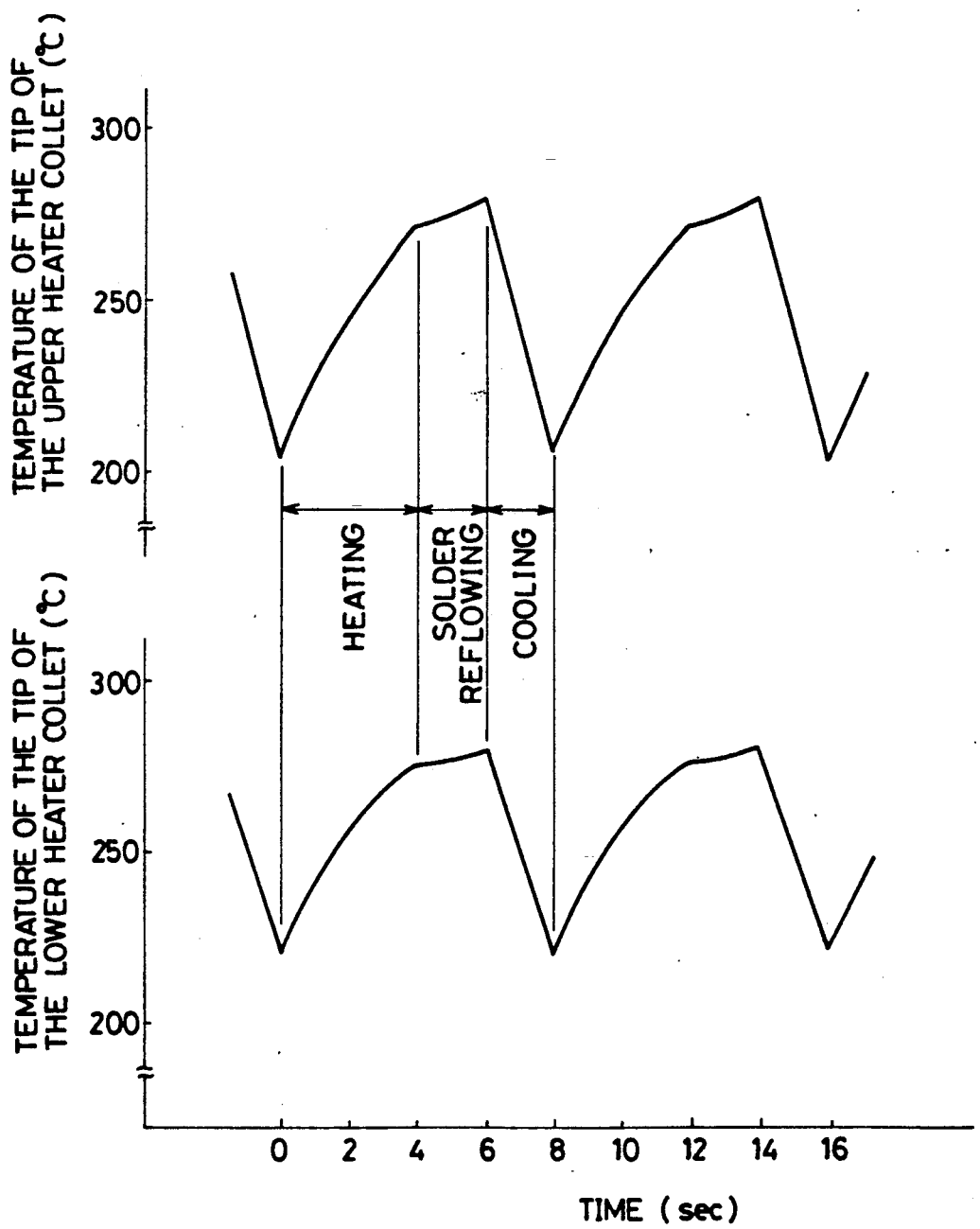
FIG. 7 shows a temperature characteristic at the tips of the upper and the lower heater collet during a continuous driving.

The following is a description of a soldering cycle. Factors which decide the soldering cycle are the temperature characteristics at the tip of the heater collet. FIG. 7 shows a temperature characteristic at the tips of the upper and the lower heater collets during a continuous driving.

The soldering cycle includes a heating step, a solder reflowing step, and a cooling step. All the steps form a tact time frequency.

When a temperature of the tip of the heater collets is set at about 280° C. for the solder reflowing, the upper and lower integrated circuits can be adhered to the substrate with a soldering cycle of about 8 sec.

Further, the tact time can be shortened when the capacity of the heater increases, and the cooling method and the film design are improved.

The invention being thus described, it will be obvious that the same may be varied in many ways. Such variations are not to be regarded as a departure from the spirit and scope of the invention, and all such modifications are intended to be included within the scope of the following claims.

What is claimed is:

1. A method of manufacturing an integrated circuit substrate, comprising the steps of:
    arranging and temporarily fixing a first integrated circuit package, which includes an integrated circuit in its main body and is provided with outer leads on its periphery, on one side of a substrate and a second integrated circuit package, which includes an integrated circuit in its main body and is provided with outer leads on its periphery, on the other side of said substrate in a symmetrical position of said first integrated circuit package, said substrate being provided with solder plating layers on both sides thereof at positions opposed to said outer leads and through holes for connecting said outer leads of said first and second integrated circuit packages to each other via said solder plating layers; and
    pressing and heading said outer leads of said first and second integrated circuit packages simultaneously from both sides of said substrate by use of a pair of heater collets, each of which is disposed at each side of said substrate and movable toward and away from said substrate so as to sandwich said substrate with said first and second integrated circuit packages therebetween and includes projections each applying pressure and heat to each of said outer leads, so as to adhere said outer leads to said solder plating layers.

2. A method of manufacturing an integrated circuit substrate for driving matrix electrodes, comprising the steps of:
    arranging and temporarily fixing a first integrated circuit package, which includes an integrated transistor circuit in its main body and is provided with outer leads on its periphery, on one side of a substrate and a second integrated circuit package, which includes an integrated diode circuit in its main body and is provided with outer leads on its periphery, on the other side of said substrate in a symmetrical position of said first integrated circuit package, said substrate being provided with solder plating layers on both sides thereof at positions opposed to said outer leads and through holes for connecting said outer leads of said first and second integrated circuit packages to each other via said solder plating layers, said integrated transistor circuit driving said matrix electrodes, said integrated diode circuit protecting an overcurrent to said matrix electrodes; and
    pressing and heating said outer leads of said first and second integrated circuit packages simultaneously from both sides of said substrate by use of a pair of heater collets, each of which is disposed at each side of said substrate and movable toward and away from said substrate so as to sandwich said substrate with said first and second integrated circuit packages therebetween and includes projections each applying pressure and heat to each of said outer leads, so as to adhere said outer leads to said solder plating layers.

3. A method according to claim 2, wherein said matrix electrodes comprise matrix electrodes of an EL display panel.

4. A method according to claim 2, wherein said substrate comprises a flexible substrate.

5. A method of manufacturing an integrated circuit substrate, comprising the steps of:
    arranging and temporarily fixing a plurality of pairs of a first integrated circuit package, which includes an integrated circuit in its main body and is provided with outer leads on its periphery, on one side of a substrate and a second integrated circuit package, which includes an integrated circuit in its main body and is provided with outer leads on its periphery, on the other side of said substrate in a symmetrical position of said first integrated circuit package respectively, said substrate being provided with solder plating layers on both sides thereof at positions opposed to said outer leads and through holes for connecting said outer leads of said first and second integrated circuit packages to each other via said solder plating layers, the number of said pairs corresponding to the number of electric lines formed on said substrate; and
    pressing and heating outer leads to said first and second integrated circuit packages in said each pair simultaneously from both sides of said substrate by use of a pair of heater collets, each of which is disposed at each side of said substrate and movable toward and away from said substrate so as to sandwich said substrate with said first and second integrated circuit packages therebetween and includes projections each applying pressure and heat to each of said outer leads, so as to adhere said outer leads to said solder plating layers, with respect to one pair after another pair of said first and second integrated circuit packages in a sequential manner.

6. A method according to claim 5, wherein, in said pressing and heating step, said substrate is transported sequentially such that a new pair of said first and second integrated circuit packages are moved to a position between said heater collets after said outer leads of a previous pair of said first and second integrated circuit packages are adhered to said solder plating layers.

7. A method of manufacturing an integrated circuit substrate for driving matrix-electrodes, comprising the steps of:

arranging and temporarily fixing a plurality of pairs of a first integrated circuit package, which includes an integrated transistor circuit in its main body and is provided with outer leads on its periphery, on one side of a substrate and a second integrated circuit package, which includes an integrated diode circuit in its main body and is provided with outer leads on its periphery, on the other side of said substrate in a symmetrical position of said first integrated circuit package respectively, said substrate being provided with solder plating layers on both sides thereof at positions opposed to said outer leads and through holes for connecting said outer leads of said first and second integrated circuit packages to each other via said solder plating layers, said integrated transistor circuit driving said matrix electrodes, said integrated diode circuit protecting an overcurrent to said matrix electrodes, the number of said pairs corresponding to the number of electrode lines of said matrix electrodes formed on said substrate; and pressing and heating said outer leads of said first and second integrated circuit packages in said each pair simultaneously from both sides of said substrate by use of a pair of heater collets, each of which is disposed at each side of said substrate and movable toward and away from said substrate so as to sandwich said substrate with said first and second integrated circuit packages therebetween and includes projections each applying pressure and heat to each of said outer leads, so as to adhere said outer leads to said solder plating layers, with respect to one pair after another pair of said first and second integrated circuit packages in a sequential manner.

* * * * *

UNITED STATES PATENT AND TRADEMARK OFFICE
CERTIFICATE OF CORRECTION

PATENT NO. : 5,137,205
DATED : August 11, 1992
INVENTOR(S) : Akio Inohara et al

It is certified that error appears in the above-indentified patent and that said Letters Patent is hereby corrected as shown below:

Title page item [30] Foreign Application Priority Data: the second number which is indicated as "58-662" should be --58-66266--.

Signed and Sealed this

Seventh Day of September, 1993

Attest:

BRUCE LEHMAN

Attesting Officer

Commissioner of Patents and Trademarks